United States Patent
Song et al.

(10) Patent No.: US 12,024,936 B2
(45) Date of Patent: Jul. 2, 2024

(54) DEVICE FOR PREVENTING HUMAN BODY FROM BEING JAMMED USING CHANGE IN CAPACITANCE

(71) Applicant: VITONET AP CO., LTD., Cheonan-si (KR)

(72) Inventors: Won Chul Song, Seoul (KR); Young Pyo Yoon, Cheonan-si (KR); Young Ju Ju, Seongnam-si (KR); Moo Seoup Yang, Gwangmyeong-si (KR)

(73) Assignee: VITONET AP CO., LTD., Cheonan-si (KR)

( * ) Notice: Subject to any disclaimer, the term of this patent is extended or adjusted under 35 U.S.C. 154(b) by 0 days.

(21) Appl. No.: 17/767,923

(22) PCT Filed: Aug. 26, 2021

(86) PCT No.: PCT/KR2021/011442
§ 371 (c)(1),
(2) Date: Apr. 11, 2022

(87) PCT Pub. No.: WO2022/055157
PCT Pub. Date: Mar. 17, 2022

(65) Prior Publication Data
US 2024/0093544 A1      Mar. 21, 2024

(30) Foreign Application Priority Data

Sep. 10, 2020    (KR) .................. 10-2020-0116240

(51) Int. Cl.
*E05F 15/46*     (2015.01)
*H01H 3/14*      (2006.01)
(52) U.S. Cl.
CPC ............ *E05F 15/46* (2015.01); *H01H 3/142* (2013.01); *E05Y 2400/40* (2013.01); *E05Y 2400/44* (2013.01)

(58) Field of Classification Search
CPC ..... E05F 15/46; H01H 3/142; E05Y 2400/40; E05Y 2400/44
(Continued)

(56) References Cited

U.S. PATENT DOCUMENTS

| | | | |
|---|---|---|---|
| 2003/0005775 A1 | 1/2003 | Washeleski et al. | |
| 2003/0071639 A1 | 4/2003 | Haag et al. | |

(Continued)

FOREIGN PATENT DOCUMENTS

| | | | |
|---|---|---|---|
| JP | 2006-501388 A | 1/2006 | |
| KR | 10-2005-0035167 A | 4/2005 | |

(Continued)

OTHER PUBLICATIONS

International Search Report for PCT/KR2021/011442 dated Dec. 16, 2021 from Korean Intellectual Property Office.

*Primary Examiner* — Tung X Nguyen
*Assistant Examiner* — Robert P Alejnikov, Jr.
(74) *Attorney, Agent, or Firm* — NKL LAW; Jae Youn Kim

(57) ABSTRACT

A device for preventing a human body from being jammed by using a change in capacitance, includes: a sensor unit which detects a change in capacitance corresponding to a gap between an external conductor pressed by a human body approaching a driven object and an internal conductor; a signal processing unit which compares a detection signal of the sensor unit with a reference value and outputs a jamming occurrence signal indicating the human body being jammed in the driven object; a motor driving unit which drives a motor to move the driven object; and a control unit which controls the motor driving unit to stop or move the driven object in the opposite direction when the jamming occur- (Continued)

rence signal is received from the signal processing unit, thereby preventing a safety accident caused by the human body being jammed.

12 Claims, 6 Drawing Sheets

(58) Field of Classification Search
 USPC .......................................................... 324/663
 See application file for complete search history.

(56) References Cited

U.S. PATENT DOCUMENTS

| | | | | |
|---|---|---|---|---|
| 2009/0314098 A1* | 12/2009 | Ogawa | ................ | H03K 17/955 |
| | | | | 73/780 |
| 2010/0024301 A1* | 2/2010 | Wuerstlein | ............ | E05F 15/46 |
| | | | | 49/28 |
| 2010/0222969 A1* | 9/2010 | Yamaguchi | ............ | B60N 2/002 |
| | | | | 701/49 |
| 2011/0128018 A1* | 6/2011 | Reime | .................... | E05F 15/46 |
| | | | | 174/70 R |
| 2011/0308365 A1* | 12/2011 | Chiu | ...................... | F16P 3/145 |
| | | | | 83/62.1 |
| 2012/0192489 A1 | 8/2012 | Pribisic | | |
| 2015/0038864 A1* | 2/2015 | Kataoka | ............... | A61B 5/0006 |
| | | | | 600/509 |
| 2016/0104585 A1* | 4/2016 | Clemente | ................. | F16P 3/12 |
| | | | | 200/600 |
| 2016/0263769 A1* | 9/2016 | Laliberte | ............... | B23D 47/08 |
| 2017/0174162 A1 | 6/2017 | Kwag et al. | | |
| 2019/0136601 A1* | 5/2019 | Evans | ...................... | E06B 9/68 |

FOREIGN PATENT DOCUMENTS

| | | |
|---|---|---|
| KR | 10-0520356 B1 | 10/2005 |
| KR | 10-2012-0081594 A | 7/2012 |
| KR | 10-1546610 B1 | 8/2015 |
| KR | 10-1566977 B1 | 11/2015 |
| KR | 10-1689583 B1 | 12/2016 |
| WO | WO-2020004985 A1 * | 1/2020 ............ B66B 13/08 |

\* cited by examiner

[FIG. 1]
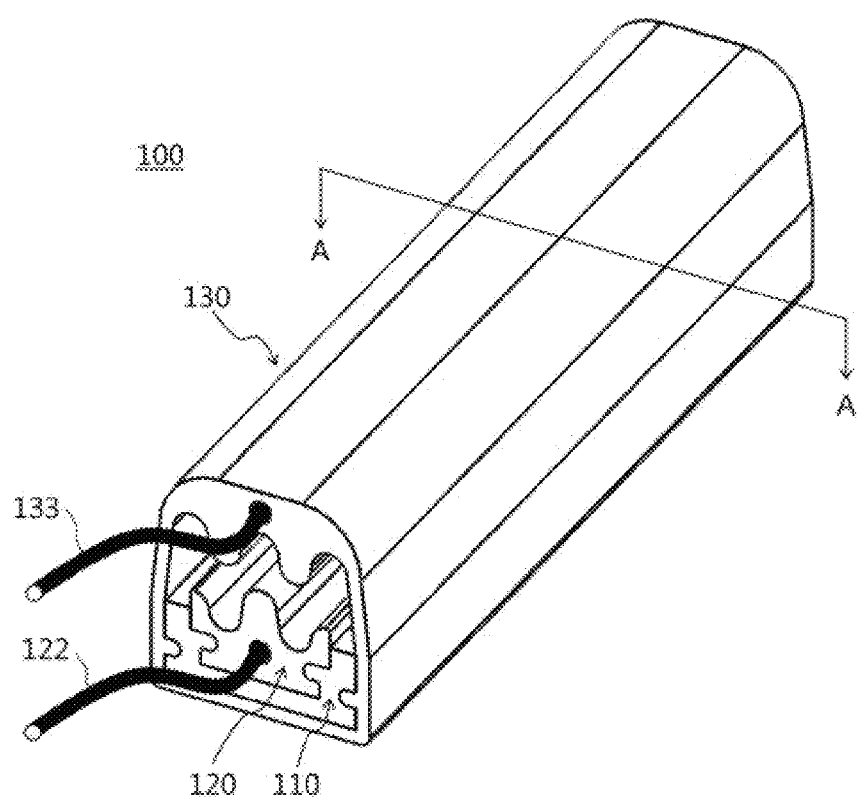

[FIG. 2]
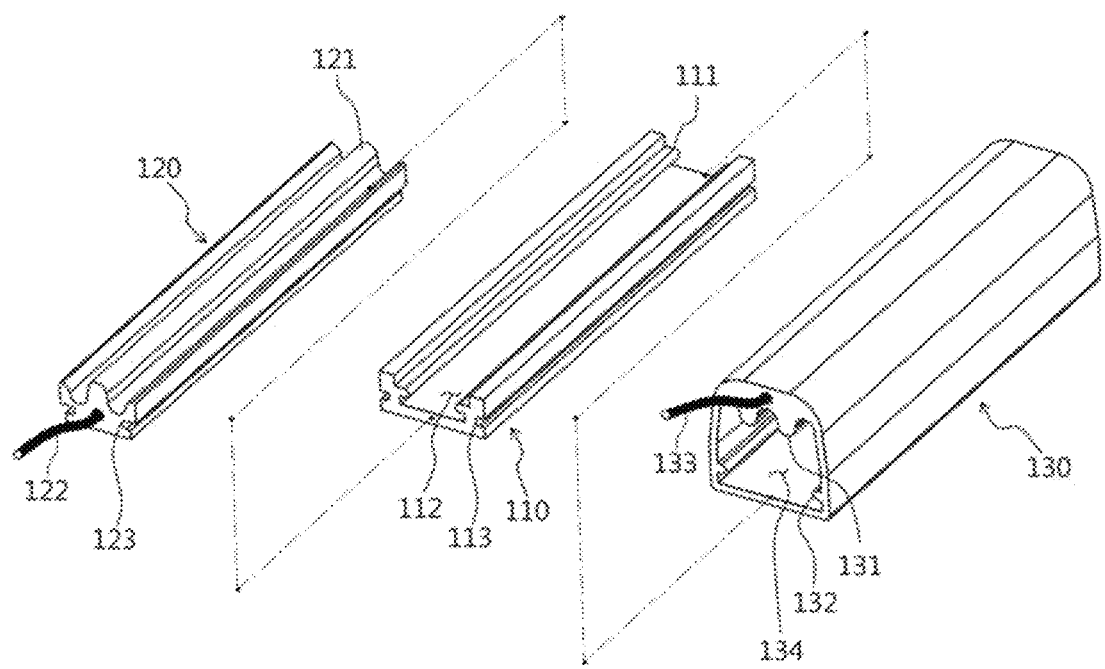

[FIG. 3]
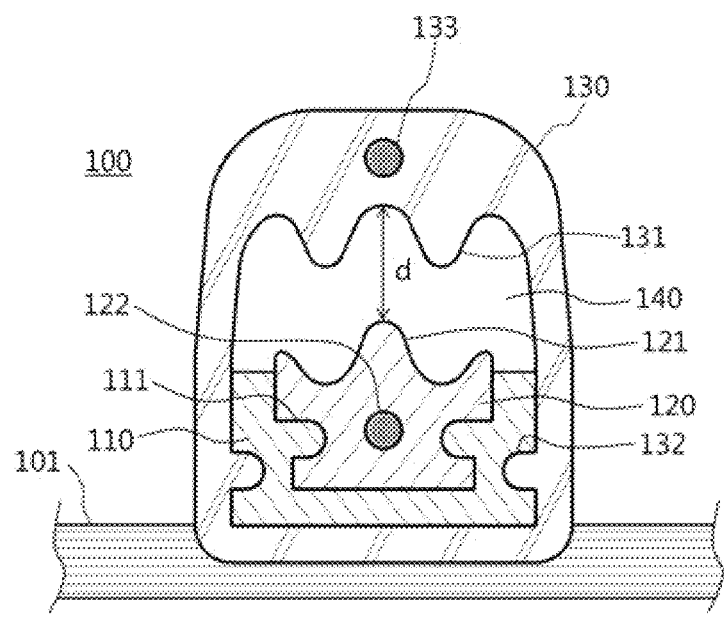

[FIG. 4]
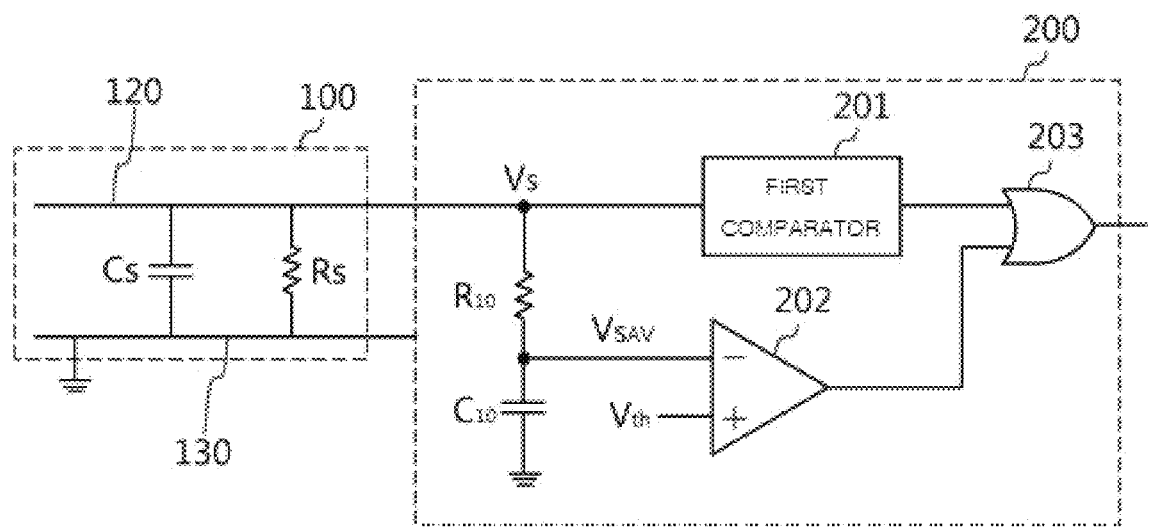

[FIG. 5]
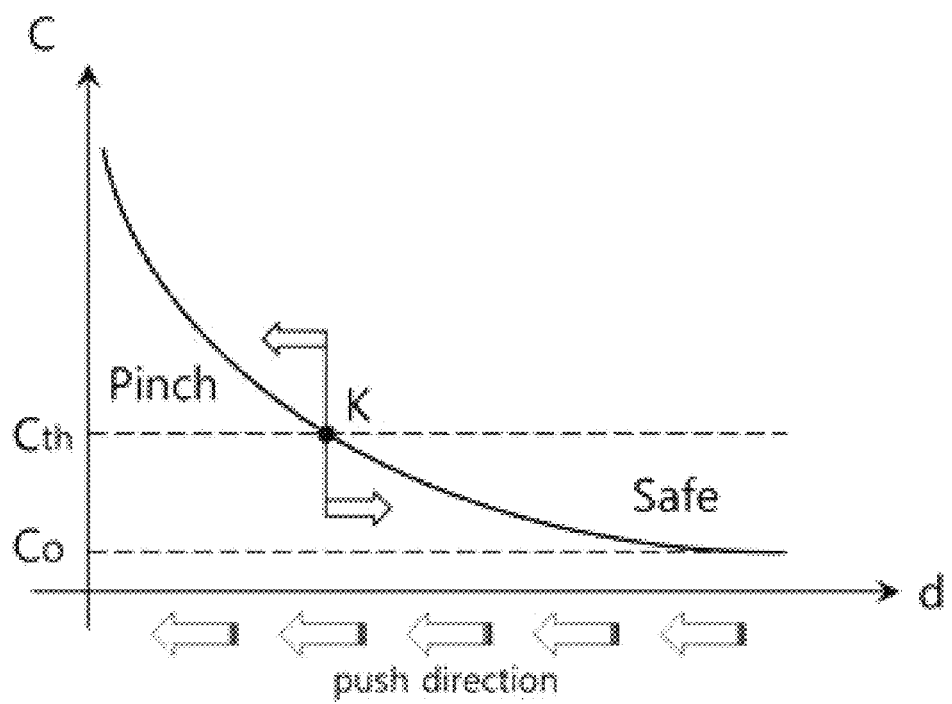

[FIG. 6]
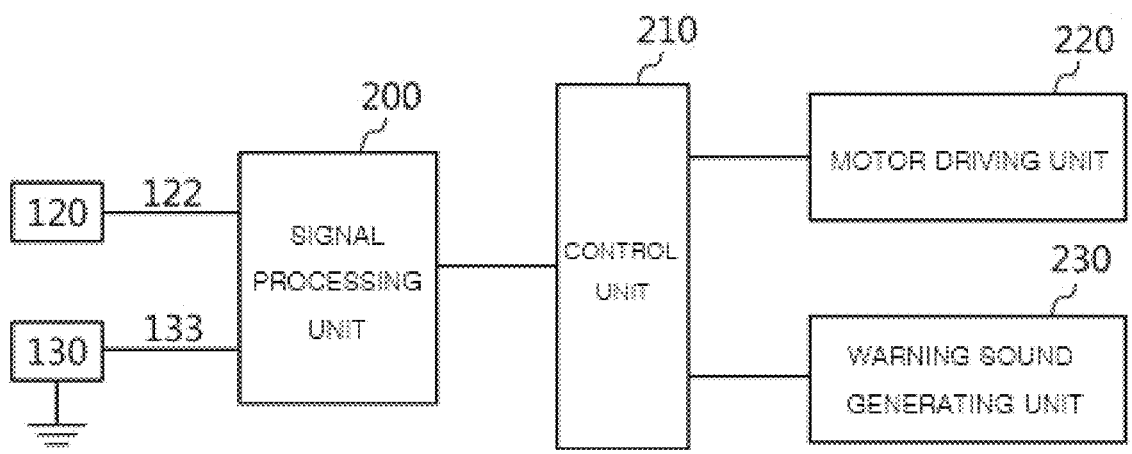

DEVICE FOR PREVENTING HUMAN BODY FROM BEING JAMMED USING CHANGE IN CAPACITANCE

TECHNICAL FIELD

The present invention relates to a device for preventing a human body from being jammed using a change in capacitance, which is capable of preventing an accident due to jamming of the human body using a sensor unit for detecting a change in capacitance.

BACKGROUND ART

A sliding door of a vehicle is convenient because a driver or a passenger can open or close the sliding door using a single button. However, when the driver closes the sliding door without checking for passengers, jamming of a human body occurs due to the sliding door, and thus there occurs a problem in that the passenger is injured.

In order to solve the above problem, as the related art, Korean Patent Registration No. 10-0520356 (registered on Oct. 4, 2005, Patent Document 1) discloses a technology which includes a laser emitting unit for emitting laser light and a laser receiving unit for receiving the laser light emitted from the laser emitting unit and in which the laser receiving unit detects an object jamming state in a jammed portion of a sliding door of a van. However, in Patent Document 1, there is a problem in that, since the laser emitting unit and the laser receiving unit, which are expensive equipment, are used, an economic burden of a user increases, and when the vehicle is traveling in an adverse conditions such as on an unpaved road, the laser emitting unit and the laser receiving unit can malfunction due to a vibration generated during traveling.

In addition, Korean Patent Registration No. 10-1566977 (registered on Nov. 2, 2015, Patent Document 2) discloses that an object present between a sliding door and a vehicle body is detected through a photosensor so that an accident in which a body or a skirt is caught between the sliding door and the vehicle body is prevented. However, in Patent Document 2, since the photosensor is contaminated by foreign materials or malfunctions due to scattered dust or strong sunlight, there is a problem in safety.

Another related art discloses a technique for controlling a motor for moving a sliding door by detecting a rotation state of the motor to detect jamming of an object. However, when jamming occurs at the door, a certain mechanical pressure needs to be applied in order for an abnormal state of the motor to be detected, and thus there is a problem of causing serious accidents for the elderly or children who have slow reaction speeds.

Another related art discloses a method of detecting an object using a capacitive sensor. However, there is a problem of causing a malfunction in which an object cannot be accurately detected when the capacitive sensor is wet with rainwater.

DISCLOSURE

Technical Problem

The present invention is directed to providing a device for preventing a human body from being jammed using a change in capacitance, which is capable of preventing an accident caused due to jamming of a human body by detecting a change in capacitance using a sensor unit which is pressed according to a touch pressure applied by the human body.

Technical Solution

One aspect of the present invention provides a device for preventing a human body from being jammed using a change in capacitance, which includes a sensor unit configured to detect a change in capacitance corresponding to a gap between an external conductor and an internal conductor which are electrically grounded to a driven object, a signal processing unit configured to compare a detection signal of the sensor unit with a reference value and output a jamming occurrence signal indicating jamming occurrence of a human body in the driven object, a motor driving unit configured to drive a motor to move the driven object, and a control unit configured to control the motor driving unit to stop movement of the driven object or move the driven object in a direction opposite to the movement when the jamming occurrence signal is received from the signal processing unit.

The driven object may be an adjunct mounted on a vehicle and include any one among side doors, a trunk door, windows, a sunroof, an elevator door, and doors of a subway, and the sensor unit is formed in the form of a strip which is bent to correspond to a side shape of the driven object.

The sensor unit may be formed such that the external conductor, the internal conductor, and a support are integrated, and the support may be coupled between the external conductor and the internal conductor and prevent the external conductor from being in direct contact with the internal conductor to electrically insulate the external conductor from the internal conductor.

Protruding pillars may be vertically formed on both sides of the support in a lengthwise direction, a recessed seating groove may be formed between the protruding pillars facing each other, and a bottom surface of the internal conductor is in contact with the seating groove.

A pair of first slits extending in the lengthwise direction may be formed in outer sides of the protruding pillars on both sides of the support, and a pair of fitting protrusions extending in the lengthwise direction may be formed on inner sides of the protruding pillars on both sides of the support.

A pair of second fitting protrusions may be formed on an inside of the external conductor, and the second fitting protrusion may be coupled to the first slit of the support.

A pair of second slits extending in the lengthwise direction may be formed in outer sides of pillars on both sides of the internal conductor, and the first fitting protrusion of the support may be coupled to the second slit.

A first signal cable embedded in the support may be drawn out and connected to the signal processing unit, and a second signal cable embedded in the external conductor may be drawn out and connected to the signal processing unit.

The external conductor may be formed in a dome shape, one end portion of the outer conductor and one end portion of the internal conductor may each be formed in a sawtooth shape, and an air layer may be formed between the external conductor and the internal conductor.

The sensor unit may be formed by integrally molding the external conductor, the internal conductor, and the support using a triple injection molding machine.

The external conductor may be made of a flexible material which is pressed according to a touch pressure of the human body.

The external conductor and internal conductor may be formed of a composite material of a thermoplastic elastomer and carbon nanotubes by molding.

The carbon nanotubes at 20 to 60% by weight may be mixed with the thermoplastic elastomer.

The support may be formed of a thermoplastic elastomer by molding.

The sensor unit may output changes in capacitance and resistance according to the gap between the external conductor and the internal conductor, the signal processing unit may include a first comparator configured to compare the detected capacitance of the sensor unit with a predetermined first reference value, and a second comparator configured to compare a divided voltage corresponding to the change in resistance of the sensor unit with a predetermined second reference value, wherein the first comparator may output the jamming occurrence signal when the detected capacitance is greater than the first reference value, and the second comparator may output the jamming occurrence signal when the divided voltage corresponding to the detected resistance is smaller than the second reference value.

Advantageous Effects

In accordance with the present invention, an external conductor and an internal conductor are integrated and manufactured in the form of a thin strip so that the external conductor and the internal conductor can be installed to be bent in accordance with a shape of an object, and thus installation work can be easily and conveniently performed. The external conductor and the internal conductor can be applied to various fields including sliding doors.

In accordance with the present invention, it is possible to detect jamming occurrence according to a change in capacitance of a sensor unit including the external conductor and the internal conductor, and in a situation in which the external conductor and the internal conductor are bonded due to an excessive external force applied to the external conductor, the jamming occurrence can be detected according to the change in resistance of the sensor unit so that operation stability can be secured in various use environments.

In accordance with the present invention, since the external conductor and the internal conductor are each formed in a sawtooth shape to increase a facing surface area between the external conductor and the internal conductor, capacitance which is varied proportional to a gap between the external conductor and the internal conductor can be sensitively detected so that sensor performance can be improved.

In accordance with the present invention, since the external conductor of the sensor unit is sealed and a grounding structure is applied to the external conductor, a malfunction due to foreign materials such as rainwater or dust is prevented so that reliability can be improved.

BRIEF DESCRIPTION OF THE DRAWINGS

FIG. 1 is a perspective view illustrating an exterior of a sensor unit according to an embodiment of the present invention.

FIG. 2 is an exploded perspective view illustrating the sensor unit according to the embodiment of the present invention.

FIG. 3 is a cross-sectional view along line A-A of the sensor unit according to the embodiment of the present invention.

FIG. 4 is a detailed circuit diagram illustrating the sensor unit and a signal processing unit according to an embodiment of the present invention.

FIG. 5 is a graph showing capacitance which varies according to a touch pressure applied to the sensor unit by a human body according to an embodiment of the present invention.

FIG. 6 is a control block diagram illustrating a device for preventing a human body from being jammed using a change in capacitance according to an embodiment of the present invention.

MODES OF THE INVENTION

Hereinafter, embodiments of the present invention will be described with reference to the accompanying drawings. The same reference numerals in each drawing indicate the same members. In addition, in describing the present invention, when a detailed description of a known related function or configuration is determined to unnecessarily obscure the gist of the present invention, the detailed description thereof will be omitted herein.

Further, when a part is referred to as "including" a component, this does not mean that other elements are excluded, and the part can include another element unless specifically stated otherwise.

In order to prepare for occurrence of jamming due to user negligence when a sliding door installed in a vehicle is driven using an electric motor, a device for preventing a human body from being jammed using a change in capacitance according to an embodiment of the present invention may have an anti-pinch function, which automatically stops a sliding door or drives the sliding door in an opposite direction, using a sensor unit for detecting a change in capacitance, thereby securing safety of a user.

The device for preventing a human body from being jammed using a change in capacitance may be applied to various technical fields for driving a driven object using an electric motor. For example, when an electric automatic opening and closing system capable of automatically opening and closing side doors, a trunk door, windows, and a sunroof as adjuncts mounted on a vehicle is employed as a convenience functions for a user, a safety device of an automatic sliding door according to an embodiment may be added. As another example, the safety device of an automatic sliding door according to the embodiment may also be added when an automatic opening and closing method is employed, such as an elevator door of a building or an entrance door of a subway.

As shown in FIGS. 1 and 2, the device for preventing a human body from being jammed using a change in capacitance of an embodiment according to the present invention may include a sensor unit 100 for detecting a change in capacitance proportional to a touch pressure applied by a human body approaching an automatic sliding door.

FIG. 1 is a perspective view illustrating an exterior of a sensor unit according to an embodiment of the present invention, and FIG. 2 is an exploded perspective view illustrating the sensor unit according to the embodiment of the present invention.

The sensor unit 100 may be installed on a side portion of a sliding door which is a driven object which moves forward or backward by an electric motor. A position of the sensor unit 100 does not need to be particularly limited, and the sensor unit 100 may be installed without limitation on an externally exposed position to respond to a touch pressure applied by an approaching human body.

As shown in FIGS. 1 and 2, the sensor unit 100 may be formed to extend in a lengthwise direction. The sensor unit 100 may be manufactured in the form of a strip which is bent to correspond to a shape of the side portion of the sliding door. The sensor unit 100 may include a support 110, an internal conductor 120, and an external conductor 130.

The support 110 and the internal conductor 120 are integrally installed in the external conductor 130.

The support 110 is coupled between the external conductor 130 and the internal conductor 120 to prevent the external conductor 130 from being in direct contact with the internal conductor 120. In addition, the support 110 is formed of an electrically insulating material. For example, the support 110 may be molded by supplying a thermoplastic elastomer (TPE) to an injection molding machine.

The external conductor 130 is an envelope of the sensor unit 100 exposed to the outside and is formed in a hollow dome-shaped exterior. The external conductor 130 may be formed of a flexible material which is pressed with a touch pressure of the human body. A tunnel-shaped accommodating space 134 is formed inside the external conductor 130, and the support 110 and the internal conductor 120 are accommodated in the accommodating space 134.

The external conductor 130 and the internal conductor 120 may be molded by supplying a composite material of a TPE and carbon nanotubes (CNTs) having conductivity to an injection molding machine. Here, the CNTs at 20 to 60% by weight are mixed with the TPE.

Since the support 110, the internal conductor 120, and the external conductor 130 may be integrally molded using a triple injection molding machine and the TPE is adopted as a common material, the internal conductor 120 and the external conductor 130 bonded by the medium of the support 110 have excellent interface bonding strength and improved durability.

As shown in FIG. 2, protruding pillars are vertically formed on both sides of the support 110 in the lengthwise direction, and a recessed seating groove 112 is formed between the protruding pillars facing each other.

A bottom surface and both side surfaces of the support 110 are in contact with an inner surface of the external conductor 130, and a bottom surface of the internal conductor 120 is in contact with the seating groove 112 on an upper surface of the support 110.

A pair of first slits 113 extending in the lengthwise direction are formed in outer sides of the pillars on both sides of the support 110, and a pair of first fitting protrusions 111 extending in the lengthwise direction are formed on inner sides of the pillars of the support 110.

A pair of second fitting protrusions 132 are formed on an inner side of the external conductor 130, and the second fitting protrusions 132 are coupled to the first slits 113 of the support 110 accommodated in the accommodating space 134.

A pair of second slits 123 extending in the lengthwise direction are formed in outer sides of pillars on both sides of the internal conductor 120. The first fitting protrusion 111 of the support 110 is coupled to the second slit 123 of the internal conductor 120 located in the seating groove 112.

A first signal cable 122 embedded in the support 110 is drawn out and connected to a signal processing unit 200 which will be described below, and a second signal cable 133 embedded in the external conductor 130 is drawn out and connected to the signal processing unit 200.

As shown in FIG. 3, a bottom surface of the external conductor 130 is coupled to the fixing unit 101 of an object, and the fixing unit 101 is implemented as a conductor to allow the external conductor 130 to be electrically grounded. FIG. 3 is a cross-sectional view along line A-A of the sensor unit according to the embodiment of the present invention. In addition, both ends of the external conductor 130 may be sealed to secure tightness.

In an embodiment, the fixing unit 101 may be a part of a frame body of a vehicle, but the present invention is not limited thereto. For example, the external conductor 130 may be grounded by being electrically connected to a conductive object at an installation position.

An empty space not filled with the support 110 and the internal conductor 120 is formed in the accommodating space 134 of the external conductor 130. That is, as shown in FIG. 3, an air layer 140 is formed between an inner upper portion of the external conductor 130 and the internal conductor 120.

A first peak 121 of the internal conductor 120 and a second peak 131 of the external conductor 130 are disposed to face each other with the air layer 140 interposed therebetween and are spaced apart from each other by a predetermined gap d. Capacitance of the external conductor 130 and the internal conductor 120 in a normal state in which the separation by the predetermined gap d is maintained may be set as a reference value.

When the flexible external conductor 130 is pressed due to a touch pressure of the human body and thus shape deformation occurs temporarily, the gap between the first peak 121 and the second peak 131 facing each other may narrow. Since the gap between the first peak 121 and the second peak 131 narrows or widens according to the touch pressure, a change in capacitance may be induced in response to a change in the gap. In an embodiment, the first peak 121 of the internal conductor 120 and the second peak 131 of the external conductor 130 are each formed in a sawtooth shape. Since the first peak 121 and the second peak 131 facing each other are each formed in a sawtooth shape, when the first peak 121 and the second peak 131 are close to each other, the change in capacitance may be sensitively detected as surface areas facing each other increase.

When the external conductor 130 is pressed by the human body approaching the sliding door, the second peak 131 of the external conductor 130 approaches the first peak 121 of the internal conductor 120, and the gap d is varied according to displacement of the external conductor 130. The change in capacitance corresponding to the gap d is detected so that a jamming phenomenon of the human body may be recognized.

FIG. 4 is a detailed circuit diagram illustrating the sensor unit and a signal processing unit according to an embodiment of the present invention, and FIG. 5 is a graph showing capacitance which varies according to a touch pressure applied to the sensor unit by a human body according to an embodiment of the present invention.

As shown in FIG. 4, the sensor unit 100 may be described as an equivalent circuit including a capacitance Cs and a resistance Rs. The gap d between the first peak 121 of the internal conductor 120 and the second peak 131 of the external conductor 130 is varied according to the displacement of the external conductor 130, and a detection signal according to the capacitance Cs and the resistance Rs corresponding to the variation of the gap d is applied to the signal processing unit 200.

Capacitance C of the sensor unit 100 may be expressed as Equation 1 below.

$$C = \varepsilon S/d \qquad \text{(Equation 1)}$$

Here, d denotes a distance between the first peak of the inner conductor and the second peak of the outer conductor, S denotes a surface area between the first peak of the inner conductor and the second peak of the outer conductor, and denotes a dielectric constant.

Referring to FIG. 5, when the external conductor 130 is pressed by a touch pressure of the human body and thus the gap d is narrowed, the capacitance C of the sensor unit 100 becomes greater than a first reference value $C_{th}$. As described above, when the capacitance C becomes greater than the first reference value $C_{tn}$, it may be recognized as a case in which the jamming phenomenon (Pinch) occurs (a left region of a point K).

Meanwhile, as the applied pressure is released when the touch pressure of the human body is released and the external conductor 130 is restored to its original shape, the gap d widens, and thus the capacitance C of the sensor unit 100 becomes smaller than the first reference value $C_{th}$ and converges on an initial value Co. When the capacitance C becomes smaller than the first reference value $C_{th}$ and converges on the initial value Co, it may be recognized as a safe state in which the jamming phenomenon (Pinch) does not occur (a right area of the point K).

As shown in FIG. 4, the signal processing unit 200 compares the detection signal of the sensor unit 100 with a reference value and applies a jamming occurrence signal to the control unit 210, which will be described below, when a jamming phenomenon occurs in the sliding door.

The signal processing unit 200 may include a first comparator 201, a second comparator 202, and an OR gate 203.

The first comparator 201 compares the detected capacitance Cs of the sensor unit 100 with a preset first reference value $C_{th}$. When the capacitance Cs is greater than the first reference value $C_{th}$, that is, when jamming occurs, the jamming occurrence signal is applied to OR gate 203.

On the other hand, when a degree of a pressure applied to the external conductor 130 is excessively large and thus the second peak 131 of the external conductor 130 is bonded to the first peak 121 of the internal conductor 120, a property of a capacitor is lost. Accordingly, the jamming phenomenon of the human body corresponding to the change in capacitance cannot be recognized.

In consideration of the above description, in order to detect a change in resistance Rs between the two conductors 130 and 120 to recognize the occurrence of jamming, the second comparator 202 of the signal processing unit 200, which will be described below, is provided.

The second comparator 202 compares a divided voltage $V_{SAV}$, which is varied due to resistance detected by the sensor unit 100, with a predetermined second reference value Vth. When the divided voltage $V_{SAV}$ is smaller than the predetermined second reference value Vth, it is recognized as a case in which the jamming phenomenon occurs, and thus a jamming occurrence signal is applied to the OR gate 203.

The OR gate 203 receives the jamming occurrence signal of the first comparator 201 and the jamming occurrence signal of the second comparator 202 and outputs the jamming occurrence signals to the control unit 210.

As shown in FIG. 6, when the jamming occurrence signal is received from the OR gate 203 of the signal processing unit 200, in order to control a motor driving unit 220 to move the sliding door, the control unit 210 may stop the running motor or drive the motor in an opposite direction, thereby preventing an accident due to jamming of the human body. FIG. 6 is a control block diagram illustrating a device for preventing a human body from being jammed using a change in capacitance according to an embodiment of the present invention.

In addition, the control unit 210 may output a warning sound through a warning sound generating unit 230 to allow jamming occurrence of an external user to be checked.

The above description of the present invention is intended only for an illustrative purpose, and it can be easily understood that other concrete forms can be devised by those skilled in the art without changing or modifying the technical spirit or essential characteristics of the present invention.

The invention claimed is:

1. A device for preventing a human body from being jammed, the device comprising:
    a sensor configured to detect a change in capacitance corresponding to a gap between an external conductor and an internal conductor which are electrically grounded to a driven object;
    a signal processor configured to compare a detection signal of the sensor with a reference value and output a jamming occurrence signal indicating jamming occurrence of the human body in the driven object;
    a motor configured to move the driven object; and
    a controller configured to control the motor to stop movement of the driven object or move the driven object in a direction opposite to the movement when the jamming occurrence signal is received from the signal processor,
    wherein:
    the sensor is formed such that the external conductor, the internal conductor, and a support are integrated; and
    the support is coupled between the external conductor and the internal conductor and prevents the external conductor from being in direct contact with the internal conductor to electrically insulate the external conductor from the internal conductor,
    wherein:
    protruding pillars are vertically formed on both sides of the support in a lengthwise direction;
    a recessed seating groove is formed between the protruding pillars facing each other; and
    a bottom surface of the internal conductor is in contact with the seating groove, and
    wherein:
    a pair of first slits extending in the lengthwise direction are formed in outer sides of the protruding pillars on both sides of the support; and
    a pair of fitting protrusions extending in the lengthwise direction are formed on respective inner sides of the protruding pillars on both sides of the support.

2. The device of claim 1, wherein:
    the driven object is an adjunct mounted on a vehicle and includes any one among side doors, a trunk door, windows, a sunroof, an elevator door, and doors of a subway; and
    the sensor is formed in the form of a strip which is bent to correspond to a side shape of the driven object.

3. The device of claim 1, wherein:
    a pair of second fitting protrusions are formed on an inside of the external conductor; and
    one of the pair of second fitting protrusions is coupled to one of the pair of first slits of the support.

4. The device of claim 1, wherein:
    a pair of second slits extending in the lengthwise direction are formed in outer sides of pillars on both sides of the internal conductor; and one of the pair of fitting protrusions of the support is coupled to one of the pair of the second slits.

5. The device of claim 1, wherein:
a first signal cable embedded in the support is drawn out and connected to the signal processor; and
a second signal cable embedded in the external conductor is drawn out and connected to the signal processor.

6. The device of claim 1, wherein:
the external conductor is formed in a dome shape;
one end portion of the external conductor and one end portion of the internal conductor are each formed in a sawtooth shape; and
an air layer is formed between the external conductor and the internal conductor.

7. The device of claim 1, wherein the sensor is formed by integrally molding the external conductor, the internal conductor, and the support.

8. The device of claim 1, wherein the external conductor is made of a flexible material.

9. The device of claim 1, wherein the external conductor and internal conductor are formed of a composite material of a thermoplastic elastomer and carbon nanotubes.

10. The device of claim 9, wherein the carbon nanotubes at 20 to 60% by weight are mixed with the thermoplastic elastomer.

11. The device of claim 1, wherein the support is formed of a thermoplastic elastomer by molding.

12. The device of claim 1, wherein:
the sensor outputs changes in capacitance and resistance according to the gap between the external conductor and the internal conductor;
the signal processor includes:
a first comparator configured to compare the detected capacitance of the sensor with a predetermined first reference value; and
a second comparator configured to compare a divided voltage corresponding to the change in resistance of the sensor with a predetermined second reference value,
wherein the first comparator outputs the jamming occurrence signal when the detected capacitance is greater than the first reference value, and
the second comparator outputs the jamming occurrence signal when the divided voltage corresponding to the detected resistance is smaller than the second reference value.

* * * * *